(12) United States Patent
Chu et al.

(10) Patent No.: US 7,202,704 B2
(45) Date of Patent: Apr. 10, 2007

(54) LEAKAGE SENSING AND KEEPER CIRCUIT FOR PROPER OPERATION OF A DYNAMIC CIRCUIT

(75) Inventors: Sam Gat-Shang Chu, Round Rock, TX (US); Peter Juergen Klim, Austin, TX (US); Michael Ju Hyeok Lee, Austin, TX (US); Jose Angel Paredes, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 10/937,703

(22) Filed: Sep. 9, 2004

(65) Prior Publication Data

US 2006/0049850 A1 Mar. 9, 2006

(51) Int. Cl.
*H03K 19/096* (2006.01)
*H03K 19/00* (2006.01)
*H03K 19/20* (2006.01)
*H03K 19/094* (2006.01)
*G01R 31/02* (2006.01)

(52) U.S. Cl. .................... 326/98; 326/93; 326/94; 326/95; 326/96; 326/97; 326/112; 326/119; 326/121; 324/763

(58) Field of Classification Search ............ 326/93–98, 326/112, 119, 121
See application file for complete search history.

(56) References Cited

U.S. PATENT DOCUMENTS

| | | | | |
|---|---|---|---|---|
| 6,794,901 | B2 * | 9/2004 | Bernstein et al. | 326/95 |
| 6,894,528 | B2 * | 5/2005 | Gauthier et al. | 326/16 |
| 2004/0104744 | A1 * | 6/2004 | Bosshart | 326/95 |
| 2004/0189337 | A1 * | 9/2004 | Hsu et al. | 324/763 |
| 2004/0263208 | A1 * | 12/2004 | Levy et al. | 326/98 |

* cited by examiner

*Primary Examiner*—Rexford Barnie
*Assistant Examiner*—Dylan White
(74) *Attorney, Agent, or Firm*—Duke W. Yee; Diana R. Gerhardt; Theodore D. Fay, III

(57) ABSTRACT

A method and apparatus for ensuring proper operation of a dynamic circuit is provided. A dynamic circuit instance has a plurality of outputs connected to a respective one of a plurality of leakage detector circuits. An output of each leakage detector circuit is connected with a respective one of a plurality of keeper circuits that reside at the dynamic circuit. Each of the plurality of keeper circuits has a unique size ratio with respect to a logic element size of the dynamic circuit.

20 Claims, 2 Drawing Sheets

LEAKAGE SENSING AND KEEPER CIRCUIT FOR PROPER OPERATION OF A DYNAMIC CIRCUIT

BACKGROUND OF THE INVENTION

1. Technical Field

The present invention relates generally to dynamic circuits and in particular to a method and apparatus for detecting a leakage current from a dynamic circuit. Still more particularly, the present invention provides a method and apparatus for providing a nominal keeper circuit size for a dynamic circuit based on a detected leakage current of the dynamic circuit.

2. Description of Related Art

Conventional dynamic circuits have many advantages over static circuit counterparts. However, a disadvantage of a dynamic circuit is the necessity to hold a logic-low voltage, e.g., a "0" voltage, output during an evaluate cycle. Leakage currents often make it difficult for a 0-level output to be consistently maintained on the circuit output. Often a keeper structure is added to the circuit for maintaining the 0 voltage.

It is difficult to guarantee proper operation of a dynamic circuit while at the same time guaranteeing performance in the case where technology applications are not easy to determine prior to circuit design. A keeper structure sized too large for a particular circuit application increases the difficulty for ensuring a proper evaluate cycle. A keeper structure sized too small facilitates an evaluation cycle of the dynamic circuit but may disadvantageously fail to hold logic low pre-charge values of the dynamic circuit thus failing to guarantee proper logic operation of the circuit.

Thus, it would be advantageous to provide a method and apparatus to determine the current leakage for a particular circuit application and activate a nominal keeper structure needed to guarantee proper logic operation of the dynamic circuit.

SUMMARY OF THE INVENTION

The present invention provides a method and apparatus for ensuring proper operation of a dynamic circuit. A dynamic circuit instance has a plurality of outputs connected to a respective one of a plurality of leakage detector circuits. An output of each leakage detector circuit is connected with a respective one of a plurality of keeper circuits that reside at the dynamic circuit. Each of the plurality of keeper circuits has a unique size ratio with respect to a logic element size of the dynamic circuit.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
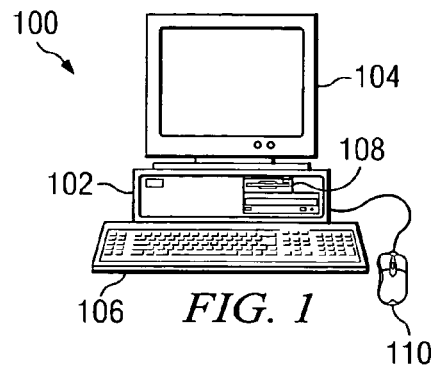
FIG. 1 is a pictorial representation of a data processing system in which the present invention may be implemented.

With reference now to the figures and in particular with reference to FIG. 1, a pictorial representation of a data processing system in which the present invention may be implemented is depicted in accordance with a preferred embodiment of the present invention. A computer 100 is depicted which includes system unit 102, video display terminal 104, keyboard 106, storage devices 108, which may include floppy drives and other types of permanent and removable storage media, and mouse 110. Additional input devices may be included with personal computer 100, such as, for example, a joystick, touchpad, touch screen, trackball, microphone, and the like. Computer 100 can be implemented using any suitable computer, such as an IBM eServer computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface (GUI) that may be implemented by means of systems software residing in computer readable media in operation within computer 100.

Figure 2:
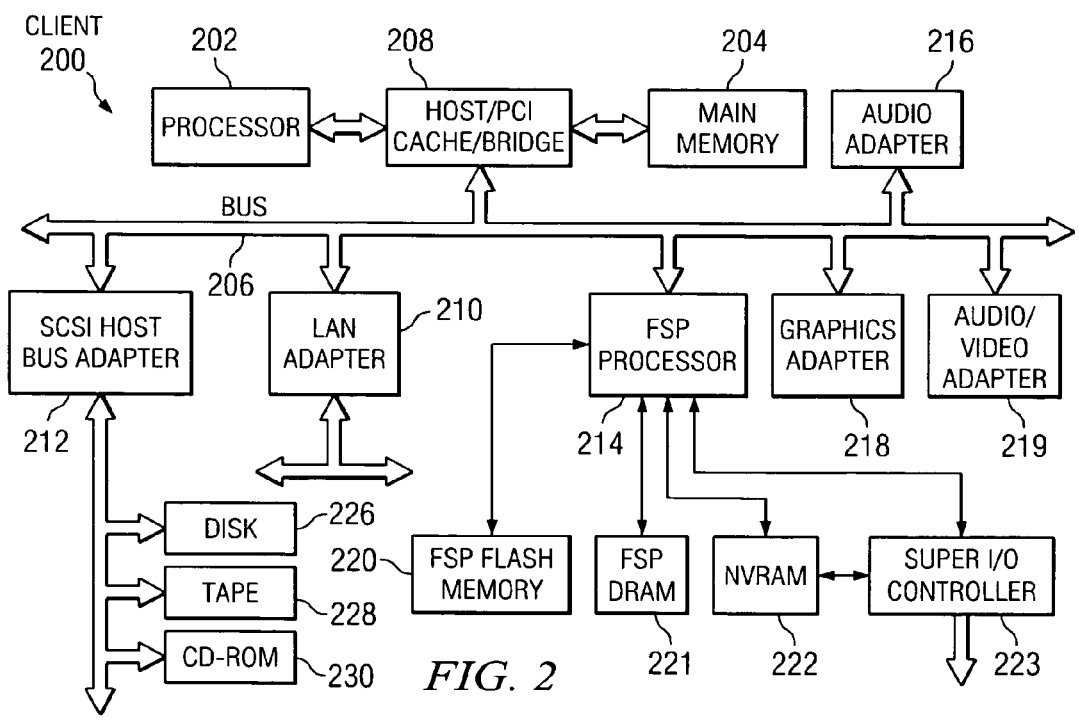
FIG. 2 is a block diagram of a data processing system shown in which a preferred embodiment of the present invention may be implemented.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in connectors. In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows XP, which is available from Microsoft Corporation. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash read-only memory (ROM), equivalent nonvolatile memory, or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230. In that case, the computer, to be properly called a client computer, includes some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

The processes of the present invention are performed by processor 202 using computer implemented instructions, which may be located in a memory such as, for example, main memory 204, memory 224, or in one or more peripheral devices 226–230.

Figure 3:
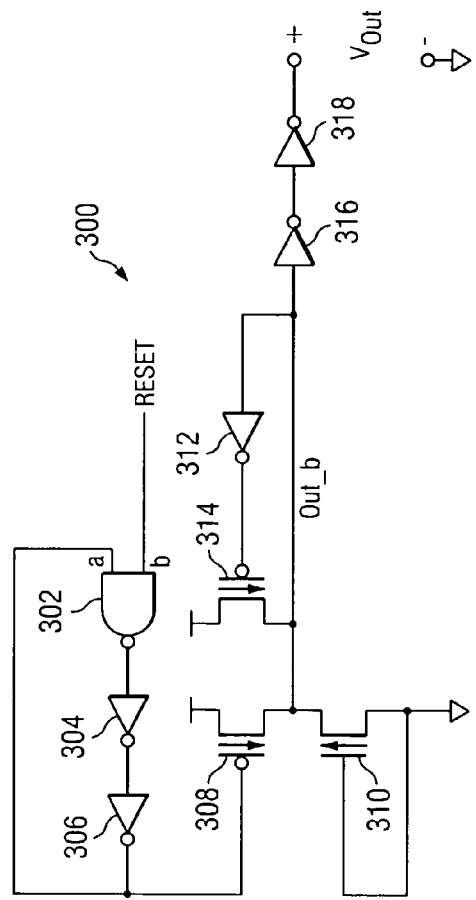
FIG. 3 is a circuit schematic of a leakage detector circuit implemented according to a preferred embodiment of the present invention.

FIG. 3 is a circuit schematic of a leakage detector circuit implemented according to a preferred embodiment of the present invention. The leakage detecting circuit shown in FIG. 3 may be implemented in a dynamic circuit, such as processor 202 of data processing system 200 shown in FIG. 2. An exemplary reset circuitry comprises NAND gate 302 having its output coupled with an input of inverter 304. The output of inverter 304 is in turn coupled with inverter 306 that is connected in a feedback configuration with NAND gate 302.

Output of the reset circuit is coupled with the gate of p-channel FET 308. The drain of FET 308 is connected with the drain of n-channel FET 310 connected in a gate-ground configuration. FET 310 is an exemplary dynamic circuit element that may have a leakage current sensed by the leakage detecting circuit of the present invention. The drain of FET 308 and drain of FET 310 are commonly connected with the input of inverter 312 of a keeper structure comprising inverter 312 and series connected p-channel FET 314. Output of inverter 312 is connected with the gate of FET 314. Series connected inverters 316 and 318 are driven with an output voltage (out_b). The output of inverter 318 provides a leakage detection output ($V_{out}$) used for activating a keeper structure implemented according to a preferred embodiment of the present invention.

In operation, the output voltage out_b is charged high by biasing p-channel FET 308 on. For illustrative purposes, assume that the RESET input of NAND gate 302 is toggled to a high voltage and is subsequently held low. On application of a high voltage to the RESET input of NAND gate 302, FET 308 is biased on and a high voltage is obtained as the output voltage out_b. When FET 308 is subsequently biased off, the design of the keeper structure comprising inverter 312 and FET 314 is such that the high voltage of out_b should be maintained.

In the event that the leakage current of FET 310 is unsuitably large for proper logical operation of the circuit, a voltage drop of the output voltage out_b is detected by the leakage detection circuit as a leakage detection output $V_{out}$ voltage drop from a high voltage level to a low voltage level. Detection of such a voltage switch of leakage detection output $V_{out}$ indicates an unsuitably high leakage current from FET 310.

If the keeper circuit is sized too large, the pre-charge voltage output may be maintained even when the leakage current of FET 310 is at an unacceptable level. If the keeper circuit is sized too small, the pre-charge value of the output voltage out_b may not be maintained thus adversely effecting the reliability of an evaluate cycle. The present invention provides a keeper structure that is sized based on the leakage detection output $V_{out}$ thereby providing a proper size ratio between a logical element, such as FET 310, and a keeper structure for enabling proper operation of the logical element.

Figure 4:
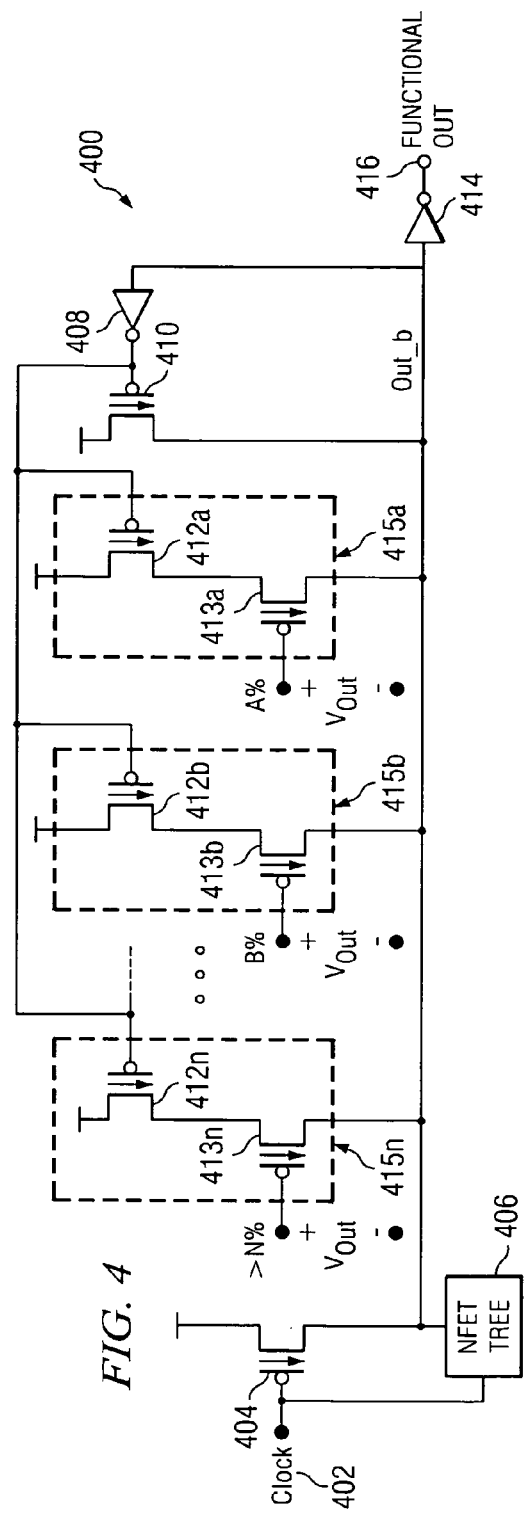
FIG. 4 is a diagrammatic schematic of a sizeable keeper circuit implemented according to a preferred embodiment of the present invention.

FIG. 4 is a diagrammatic schematic of a sizeable keeper circuit implemented according to a preferred embodiment of the present invention. Clock 402 is coupled with the gate of p-channel FET 404 and a source clock input of NFET tree 406. NFET tree 406 is an exemplary logical element or circuit for which a modified keeper circuit of the present invention is provided. An output of FET tree 406 is commonly coupled with the drain of FET 404 to inverters 408 and 414. The output of inverter 408 is coupled to the gate of FET 410 and one or more gates of respective p-channel FETs 412a–412n. Each of FETs 412a–412n are included in a FET stack 415a–415n. Each FET stack 415a–415n comprises a FET 412a–412n having a drain coupling with a source of an associated FET 413a–413n.

FETs stack 415a–415n are respectively selected to provide an increase in the current ratio between the logical element and the keeper circuit, e.g., the diffusion width ratio or N/P ratio of PET 310 to the sum of the equivalent diffusion width of stack 415a–415n. Particularly, the leakage detector output $V_{out}$ is coupled to respective gates of FETs 413a–413n. In the illustrative examples, the input at the gates of FETs 413a–413n is designated as A %–N %, where the particular percentage input is representative of the sizing ratio between the dynamic circuit, e.g., NFET tree 406, and the keeper circuit provided by the corresponding FET stacks. By increasing the size of FETs 413a–413n and 412a–412n, the amount of keeping provided to dynamic circuit output out_b is scaled according to the amount of leakage current emanating from NFET tree 406.

FET 410 provides a base keeping ratio (N/P) for holding a precharge output voltage out_b. In the illustrative example, inverter 408 and FET 410 are representative of inverter 312 and FET 314 in FIG. 3 and thus provide the base keeping ratio for the keeper structure. Each of stacks 415a–415n provide a sequential increase in the sizing ratio between NFET tree 406 and the keeping structure. In the illustrative example, the sizing ratio of NFET tree 406 and each of stacks 415a–415n increases from A percent to N percent, respectively. Thus, as the leakage current from NFET tree 406 increases, a corresponding increase in the size of the keeper structure is had by sequentially biasing on an additional stack of FET stacks 415a–415n.

In accordance with a preferred embodiment of the present invention, a leakage detector circuit, such as that described in FIG. 3, is replicated a number of times n with each leakage detector circuit instance deployed within a circuit and configured to drive a corresponding keeper structure instance comprising one to n FET stacks, respectively. That is, each leakage detector circuit instance deployed within the circuit has a corresponding keeper structure driven by the respective leakage detector circuit instance. For example, assume four (n=4) leakage detector circuit instances are deployed within a dynamic circuit. A first leakage detector circuit instance is configured to drive a keeper structure comprising a single FET stack 415a. A second leakage detector circuit instance is configured to drive a keeper structure comprising two FET stacks 415a and 415b. Likewise, a third leakage detector circuit instance and a fourth leakage detector circuit instance are each deployed within the dynamic circuit and drive respective keeper structures comprising three FET stacks 415a–415c and four FET stacks 415a–415n.

The leakage detector output $V_{out}$ of each leakage detector circuit instance is connected across respective terminals of the keeper FETs of the corresponding keeper structure. For example, the leakage detector output $V_{out}$ of the first leakage detector circuit instance is connected across a single keeper FET 413a deployed within a keeper circuit instance comprising a single FET stack 415a. The second leakage detector circuit instance has a leakage detector output $V_{out}$ connected across FET 413b of a keeper structure instance 415b. Likewise, third and fourth leakage detector circuit instances have respective outputs $V_{out}$ connected across FETs 413c and 413d respectively. Each keeper structure instance is configured as described above with reference to FIG. 4, with each keeper structure instance having a unique number of FET stacks 415a–415n.

The leakage detector circuit instances are constructed such that each provides a sequential increase in the size or P/N ratio between the leakage detector circuit instance and the corresponding keeper FET structure.

Thus, dependent on the amount of leakage current emanating from the dynamic circuit instances, one of the dynamic circuit instances will produce leakage current sufficient to switch on each of the connected keeper FET stacks. Accordingly, the output of the leakage detector circuit sufficiently ratioed with the corresponding keeper structure instance ensures proper keeping of the dynamic circuit output out_b. Accordingly, proper operation of the dynamic circuit instance is provided.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of ensuring proper operation of a dynamic circuit, comprising:
   replicating a leakage detector circuit within a dynamic circuit such that a number n of leakage detector circuit instances are deployed within the dynamic circuit;
   connecting each leakage detector circuit instance to an output of the dynamic circuit; and
   connecting an output of each leakage detector circuit instance with a respective one of a plurality of keeper circuits, wherein each of the plurality of keeper circuits has a unique size ratio with respect to a logic element size of the dynamic circuit.

2. The method of claim 1, wherein each keeper circuit has a unique number of field effect transistor stacks with respect to other keeper circuits of the plurality of keeper circuits.

3. The method of claim 2, wherein connecting an output of each leakage detector circuit instance with a respective one of the plurality of keeper circuits further includes connecting an output of each leakage detector circuit instance across a gate of a field effect transistor of the respective keeper circuit.

4. The method of claim 1, further comprising:
   connecting each leakage detector circuit instance to a respective instance of a first keeper circuitry that provides a base ratio between the logic element size and the first keeper circuitry.

5. The method of claim 1, wherein each leakage detector circuit instance comprises a series connection of a first inverter and a second inverter.

6. The method of claim 1, wherein connecting an output of each leakage detector circuit instance further comprises connecting an output of each leakage detector circuit instance with a gate of a field effect transistor of a respective field effect transistor stack.

7. The method of claim 6, wherein the plurality of keeper circuits comprise n keeper circuits.

8. The method of claim 7, wherein the plurality of keeper circuits comprise keeper circuits having respectively one to n field effect transistor stacks.

9. An apparatus for ensuring proper operation of a dynamic circuit, comprising:
   a plurality of leakage detector circuit instances;
   a dynamic circuit having an output connected to each of the plurality of leakage detector circuit instances; and
   a plurality of keeper circuits each coupled with a respective output of one of the plurality of leakage detection circuit instances, wherein each of the plurality of keeper circuits has a unique size ratio with respect to a logic element size of the dynamic circuit.

10. The apparatus of claim 9, wherein each leakage detector circuit instance comprises a series connection of inverters coupled with an output of the dynamic circuit.

11. The apparatus of claim 10, wherein each of the plurality of keeper circuits includes a first circuitry for providing a base ratio between the logic element size and the first circuitry.

12. The apparatus of claim 11, wherein each of the plurality of keeper circuits include a number of field effect transistor stacks unique among the plurality of keeper circuits.

13. The apparatus of claim 10, wherein each of the plurality of keeper circuits includes one or more field effect transistor stacks.

14. The apparatus of claim 13, wherein the plurality of keeper circuits comprises n keeper circuits and the plurality of leakage detector circuit instances comprises n leakage detector circuit instances.

15. The apparatus of claim 14, wherein each of the keeper circuits respectively comprise one through n field effect transistor stacks.

16. The apparatus of claim 15, wherein each field effect transistor stack of each of the n keeper circuits are connected with an output of a respective one of the plurality of leakage detector circuits.

17. An apparatus that facilitates proper operation of a dynamic circuit, the apparatus comprising:
 means for detecting a leakage current from a dynamic circuit; and
 means for sizing a keeper structure based on an output of the means for detecting the leakage current, wherein the output is connected with a plurality of keeper circuits each having a unique size ratio with respect to a logical element size of the dynamic circuit.

18. The apparatus of claim 17, wherein the means for detecting comprises a plurality of leakage detector circuit instances each connected with one of the plurality of keeper circuits.

19. The apparatus of claim 18, wherein the plurality of keeper circuits comprises a plurality of field effect transistor stacks.

20. The apparatus of claim 19, wherein a respective output of each of the plurality of leakage detector circuit instances is connected to drive a respective one of the plurality of field effect transistor stacks.

* * * * *